(12) United States Patent
Toyoda (10) Patent No.: US 6,551,853 B2
(45) Date of Patent: Apr. 22, 2003

(54) SENSOR HAVING MEMBRANE STRUCTURE AND METHOD FOR MANUFACTURING THE SAME

(75) Inventor: Inao Toyoda, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/841,004

(22) Filed: Apr. 25, 2001

(65) Prior Publication Data

US 2001/0040248 A1 Nov. 15, 2001

(30) Foreign Application Priority Data

May 12, 2000 (JP) .......................................... 2000-139864

(51) Int. Cl.⁷ .............................................. H01L 21/00
(52) U.S. Cl. .............................. 438/90; 438/48; 438/51; 438/53; 438/800
(58) Field of Search ............................ 438/52, 53, 50, 438/48, 800, 51; 257/417, 418, 419, 420, 254, 686, 698, 700, 704, 711

(56) References Cited

U.S. PATENT DOCUMENTS

| | | | | |
|---|---|---|---|---|
| 4,894,698 A | * | 1/1990 | Hijikigawa et al. | 257/254 |
| 5,659,195 A | * | 8/1997 | Kaiser et al. | 257/369 |
| 5,852,320 A | * | 12/1998 | Ichihashi | 257/417 |
| 5,894,144 A | * | 4/1999 | Mori et al. | 257/254 |
| 5,929,497 A | * | 7/1999 | Chavan et al. | 257/254 |
| 6,066,882 A | * | 5/2000 | Kato | 257/414 |
| 6,150,681 A | * | 11/2000 | Allen | 257/254 |
| 6,169,316 B1 | * | 1/2001 | Sakai et al. | 257/417 |
| 6,201,285 B1 | * | 3/2001 | Iwata et al. | 257/417 |
| 6,229,190 B1 | * | 5/2001 | Bryzek et al. | 257/254 |
| 6,278,167 B1 | * | 8/2001 | Bever et al. | 257/254 |
| 6,319,743 B1 | * | 11/2001 | Marchant et al. | 438/345 |
| 6,326,682 B1 | * | 12/2001 | Kurtz et al. | 257/415 |
| 6,357,299 B1 | * | 3/2002 | Aigner et al. | 73/754 |
| 6,369,931 B1 | * | 4/2002 | Funk et al. | 216/2 |
| 6,376,889 B1 | * | 4/2002 | Maeda et al. | 257/417 |
| 6,383,832 B1 | * | 5/2002 | Nakabayashi | 257/415 |
| 6,388,279 B1 | * | 5/2002 | Sakai et al. | 257/253 |
| 6,388,299 B1 | * | 5/2002 | Kang et al. | 257/415 |
| 6,405,594 B1 | * | 6/2002 | Tang et al. | 257/415 |

FOREIGN PATENT DOCUMENTS

| | | |
|---|---|---|
| JP | 6-74818 | 3/1994 |
| JP | 7-326778 | 12/1995 |

OTHER PUBLICATIONS

K. Mikami, *Sensor Technology*, vol. 2, No. 4, pp. 37–39 (Apr. 1982).

* cited by examiner

Primary Examiner—Michael S. Lebentritt
(74) Attorney, Agent, or Firm—Posz & Bethards, PLC (57) ABSTRACT

In a sensor having a membrane structure, a sensor chip (silicon substrate) is provided with a through hole that is open on both upper and lower surfaces of the silicon substrate. A sensor element having a membrane structure is formed on the upper surface of the silicon substrate to close the through hole on the upper surface. The lower surface of the silicon substrate is bonded to a stem through adhesive to define a communication passage through which an inside and an outside of the through hole communicate with each other. Accordingly, the sensor can exhibit high reliability.

20 Claims, 10 Drawing Sheets

SENSOR HAVING MEMBRANE STRUCTURE AND METHOD FOR MANUFACTURING THE SAME

CROSS REFERENCE TO THE RELATED APPLICATION

This application is based upon and claims the benefit of priority of Japanese Patent Application No. 2000-139864 filed on May 12, 2000, the content of which is incorporated herein by reference.

BACKGROUND OF THE INVENTION

1. Field of the Invention

The present invention relates to a sensor having a membrane structure.

2. Description of the Related Art

In recent years, a thermopile-type infrared sensor is manufactured as a small-sized one having a membrane by using semiconductor-material micro-machining techniques. For example, "Sensor Technology", Vol. 2, No. 4, April 1982 discloses that sensitivity of the sensor having such structure is improved by sealing a sensor chip (device) under vacuum. Further, JP-A-6-74818 discloses that sensitivity of the sensor is improved by sealing a sensor chip in low thermal-conductivity gas such as xenon gas.

The sensor chip can be sealed under vacuum or specific gas in the following steps. Specifically, first, the sensor chip is bonded to a stem, and wire bonding is carried out. Thereafter, a cap is welded under vacuum or the specific gas, so that the sensor chip bonded to the stem is sealed.

However, a through hole exists under the membrane and the through hole is sealed when the sensor chip is bonded to the stem. Therefore, when the sensor chip, bonded to the stem, is sealed under vacuum or the specific gas, gas within the through hole remains as it is. As a result, the following troubles are generated. In an infrared sensor or the like, a membrane is formed from a thin film for lowering thermal conductivity. Therefore, when the space surrounding the sensor chip bonded to the stem is evacuated in state where the inside of the through hole has atmospheric pressure, the membrane may be broken due to pressure difference.

Further, even when the sensor chip is used in atmospheric air without being sealed in the specific gas, if the through hole is hermetically sealed, gas within the through hole expands and contracts thermally and repeatedly due to changes in temperature. As a result, the membrane is repeatedly bent (distorted), so that sensor characteristics is changed or the sensor is broken in extreme cases.

SUMMARY OF THE INVENTION

The present invention has been made in view of the above problems. An object of the present invention is to provide a sensor having a membrane structure with high reliability.

According to the present invention, briefly, a communication passage is provided at a joint portion between a semiconductor substrate and a base so that an inside and an outside of a through hole in the semiconductor substrate communicate with each other through the communication passage. Accordingly, the inside and the outside of the through hole can have the same pressure. That is, an upper surface and a lower surface of a membrane structure closing the through hole at an opposite side of the base can be subject to the same pressure. As a result, the membrane structure is prevented from being damaged, resulting in high reliability.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF PREFERRED EMBODIMENTS

A description will be made with reference to FIGS. 1 through 8 on a first preferred embodiment that is an application of the present invention to a thermopile-type infrared sensor having a membrane structure. The infrared sensor is packaged with a can 7 (refer to FIG. 2), and FIG. 1 shows the infrared sensor from which the can 7 is removed.

Figure 1:
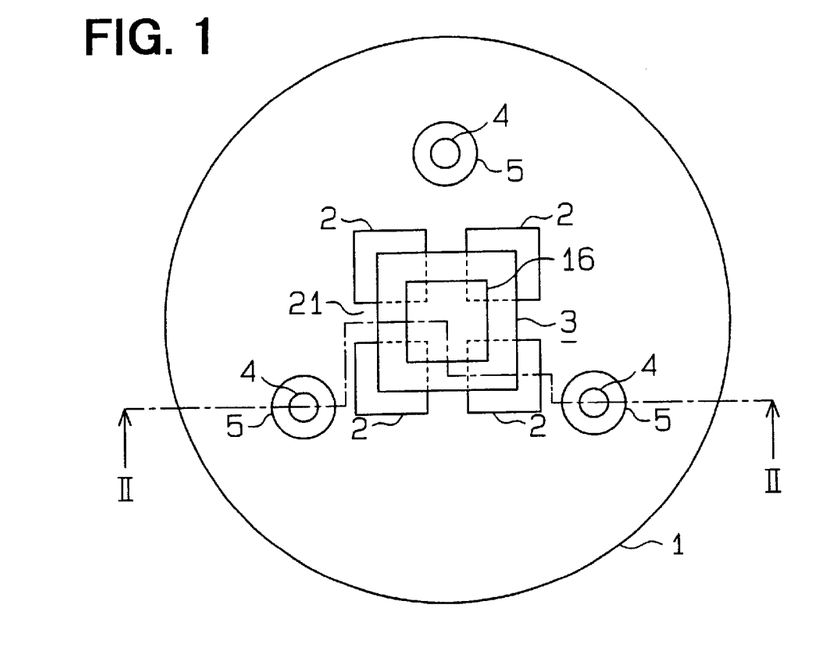
FIG. 1 is a plan view showing an infrared sensor, from which a can is removed, in a first preferred embodiment.
Figure 2:
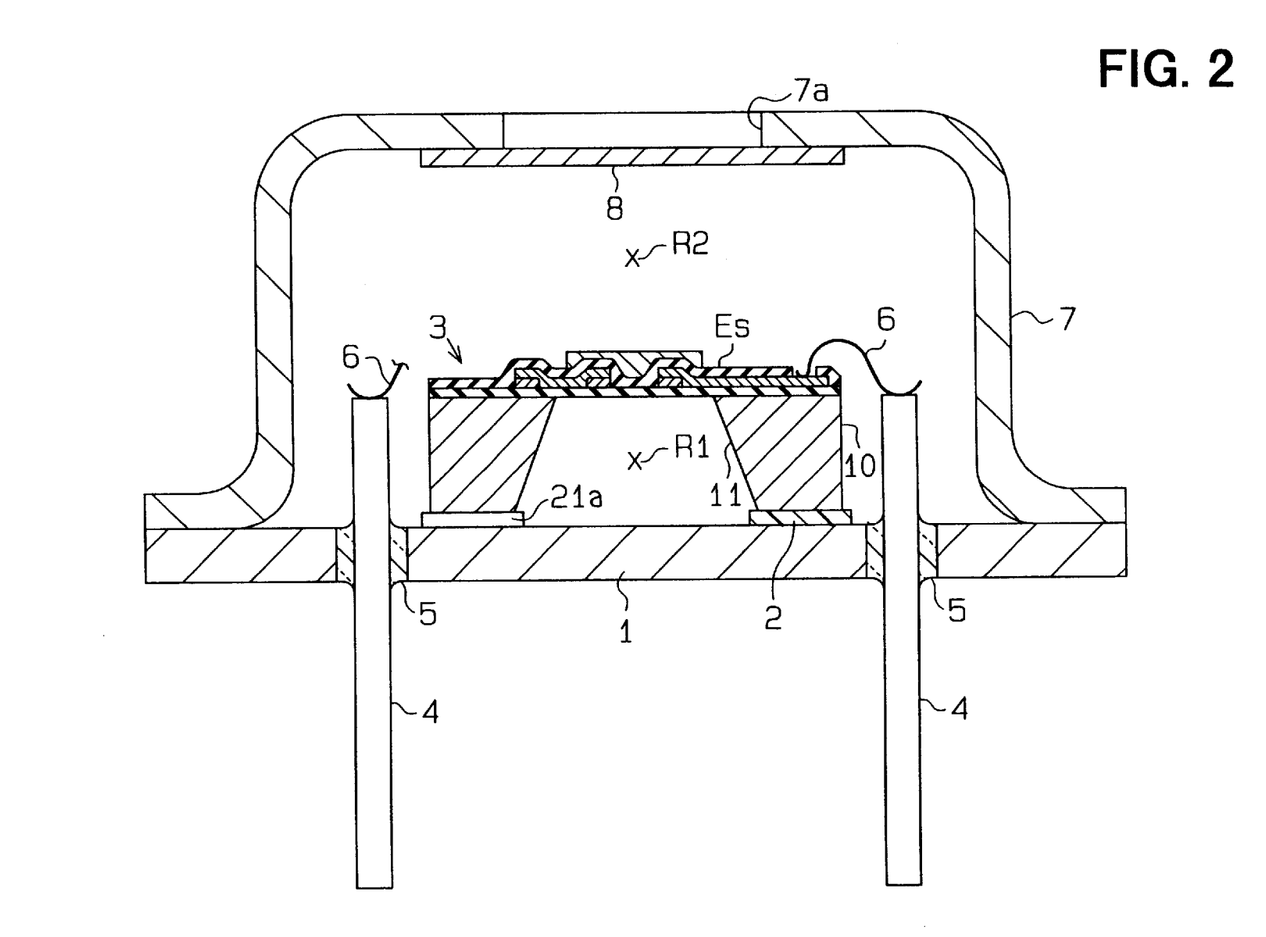
FIG. 2 is a cross-sectional view taken along line II—II in FIG. 1.

In FIGS. 1 and 2, a sensor chip (silicon substrate) 3 is bonded to a stem 1 through an adhesive layer 2 such as silver paste. Further, three pins 4 are provided to penetrate the stem 1 and to be hermetically sealed by glass 5. The sensor chip 3 and the pins 4 are electrically connected to each other through bonding wires 6. Furthermore, the cap (can) 7 is disposed on the stem 1, and a circumferential portion of the stem 1 and the cap 7 are tightly fixed to each other (sealed by welding). That is, the sensor chip 3 and the pins 4 are disposed within the cap 7. The space hermetically sealed within the cap 7 is under vacuum or filled with low thermal-conductivity gas, thereby improving sensitivity. As the low thermal-conductivity gas, xenon gas or the like can be used.

At a center portion of the cap 7, a light introduction port (opening) 7a is provided, and a filter 8 is disposed to close the light introduction port 7a. Infrared radiation is introduced from the outside into the sensor chip 3 through the filter 8.

Figure 3:
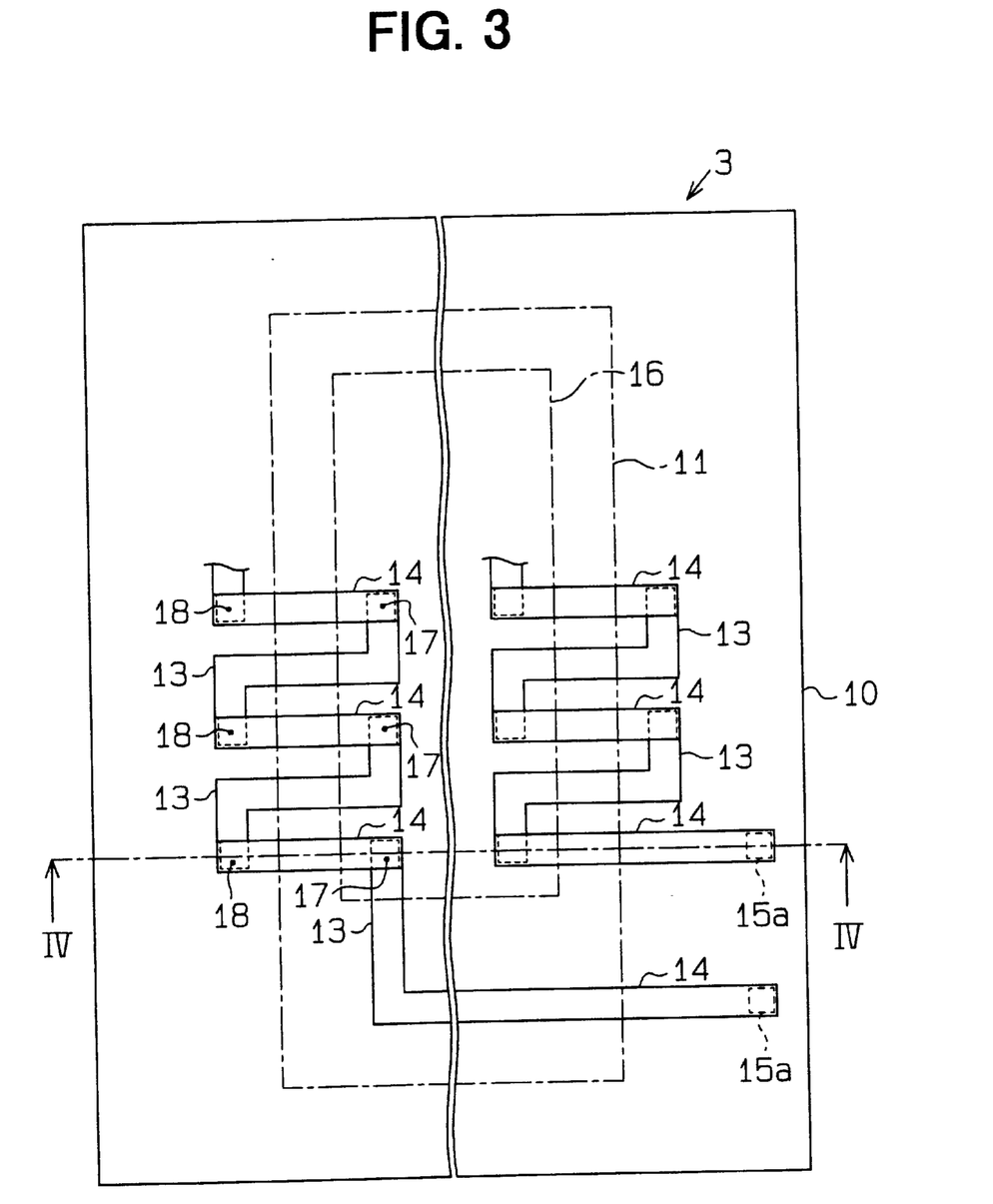
FIG. 3 is a plan view showing a sensor chip in the first embodiment.
Figure 4:
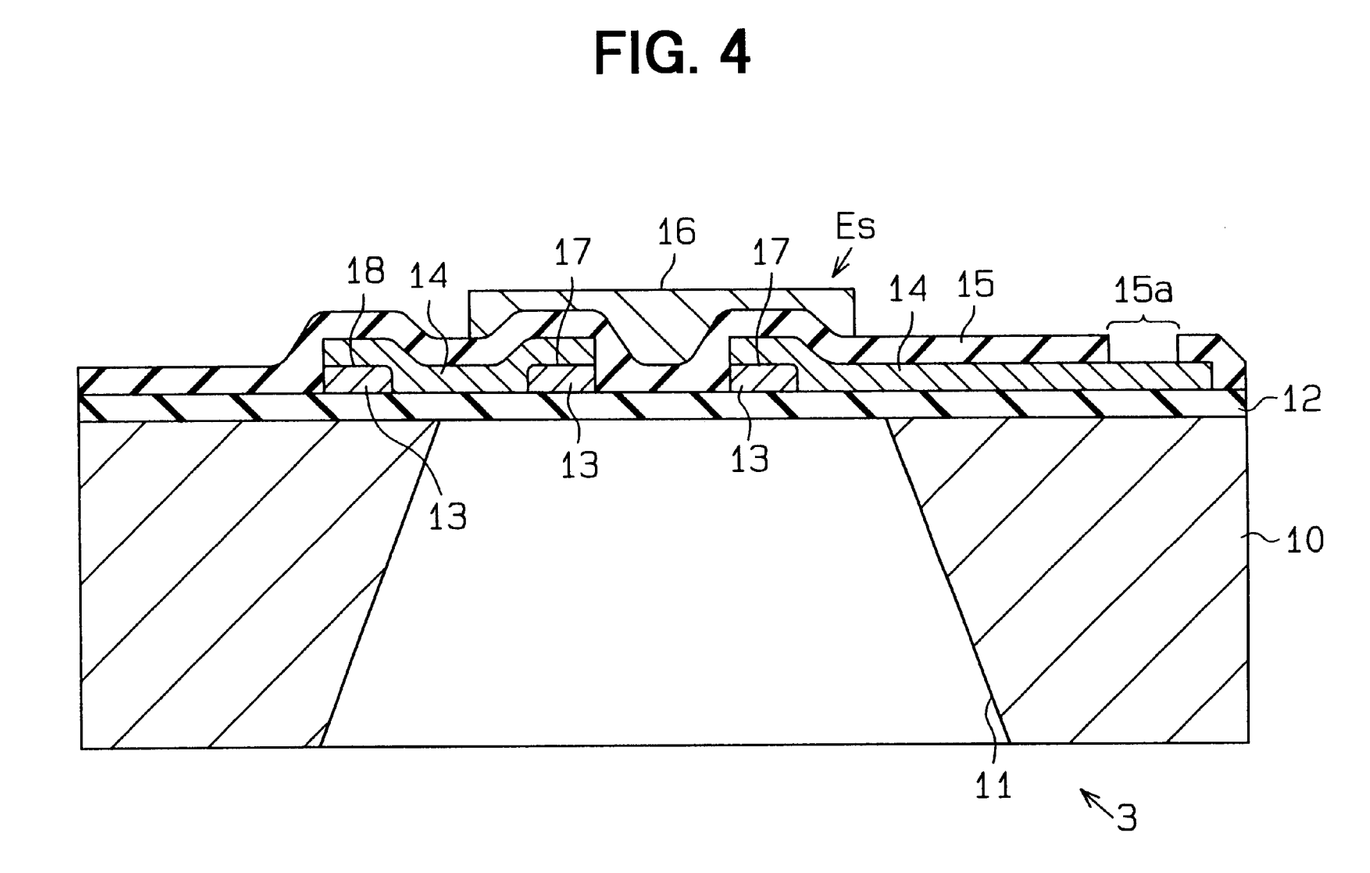
FIG. 4 is a cross-sectional view taken along line IV—IV in FIG. 3.

In FIGS. 3 and 4, a silicon substrate 10 is provided with a through hole 11 opened on both upper and lower surfaces of the silicon substrate 10. A silicon nitride film 12 is formed on the upper surface of the silicon substrate 10 to close an upper side open portion of the through hole 11. Another insulation film such as a silicon oxide film can be used in place of the silicon nitride film 12.

A poly-silicon (polycrystalline silicon) film 13 doped with an n-type impurity and an aluminum film 14 are respectively patterned on the silicon nitride film 12. Specifically, as shown in FIG. 3, the n-type poly-silicon film 13 and the aluminum film 14 alternately extend so as to partially overlap with each other. That is, the n-type poly-silicon film 13 having a strip shape and the aluminum film 14 having a strip shape extend in series so as to partially overlap with each other.

A passivation film 15 made of silicon nitride is formed on the films 13, 14. An infrared absorbent film 16 made of gold black or the like is further formed on a predetermined area of the passivation film 15. Here, portions 15a of the passivation film 15 where the bonding wires are bonded are removed.

In FIGS. 3 and 4, the infrared absorbent film 16 is disposed so as to have a square shape at a center portion of the silicon substrate 10. First overlap portions 17 between the n-type poly-silicon film 13 and the aluminum film 14 are located under the infrared absorbent film 16. Further, second overlap portions 18 are located at areas where the infrared absorbent film 16 does not overlie (outside of the infrared absorbent film 16). The first overlap portions 17 and the second overlap portions 18 form pairs, respectively, thereby forming a thermocouple group. Each pair constitutes a thermocouple, which has two different Seebeck coefficients. The films 13, 14 made of two kinds of materials can be made of conductor materials or semiconductor materials. The number of the thermocouples is, for example, several dozens.

Thus, the silicon substrate 10 is bonded to the stem (base) 1, and is provided with the through hole 11 open on both upper and lower surfaces of the silicon substrate 10. Further, a sensor element Es having the membrane structure (refer to FIG. 4) is formed on the open portion of the through hole 11 at the upper surface of the substrate 10. The thermopile-type infrared sensor has a small size with the membrane that is formed by semiconductor-material micro-machining techniques.

When infrared radiation is introduced through the filter 8, the infrared radiation is absorbed into the infrared absorbent film 16 shown in FIGS. 3 and 4 to be converted into heat. This heat generates electromotive force across the overlap portions (connection portions) 17, 18 of the n-type poly-silicon film 13 and the aluminum film 14. The electromotive force is converted into an electrical signal, and is sent outside through the bonding wires 6 and the pins 4 as a sensor signal.

In the first embodiment, although the adhesive layer 2 is provided between the silicon substrate 10 and the stem 1, an adhesive non-application area 21 (refer to FIG. 1) is provided therebetween so as to make an inner portion R1 and an outer portion R2 of the through hole 11 communicate with each other. Thereby, as shown in FIG. 2, a communication passage (adhesive non-application area) 21a is provided at the connection portion between the stem 1 and the silicon substrate 10 so that the inner portion R1 and the outer portion R2 of the through hole 11 communicate with each other through the communication passage 21a. In other words, a groove pattern is provided in the adhesive layer 2 connecting the sensor chip 3 and the stem 1 so as to form the communication passage 21a and not to hermetically seal the inner portion (cavity) R1.

The communication passage 21a is provided at plural positions (four positions in the drawing), so that the inner portion R1 and the outer portion R2 of the through hole 11 can surely communicate with each other. That is, the communication passage 21a is composed of plural communication passages, thereby preventing the communication passage 21a from being closed by adhesive or the like.

Next, a manufacturing method of the present sensor will be described.

Figure 5A:
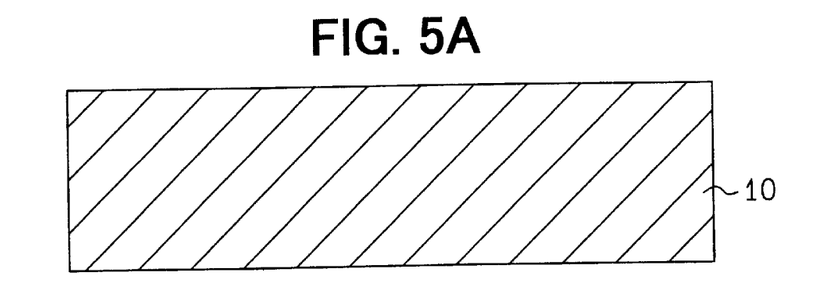
FIGS. 5A and 5B are cross-sectional views showing manufacturing steps of the infrared sensor in the first embodiment.
Figure 5B:
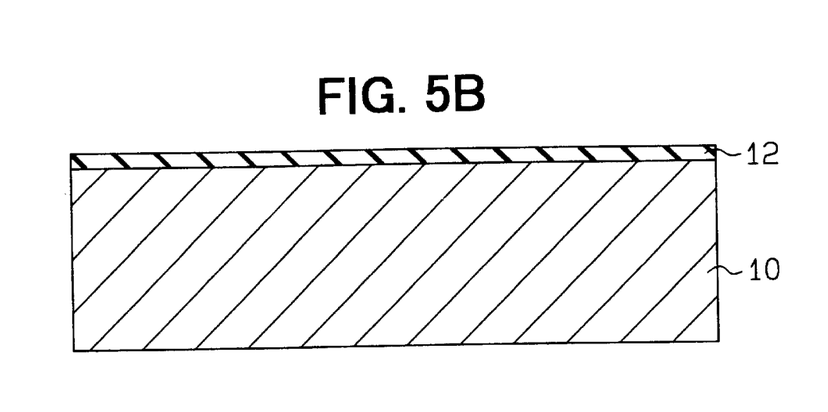
Figure 6A:
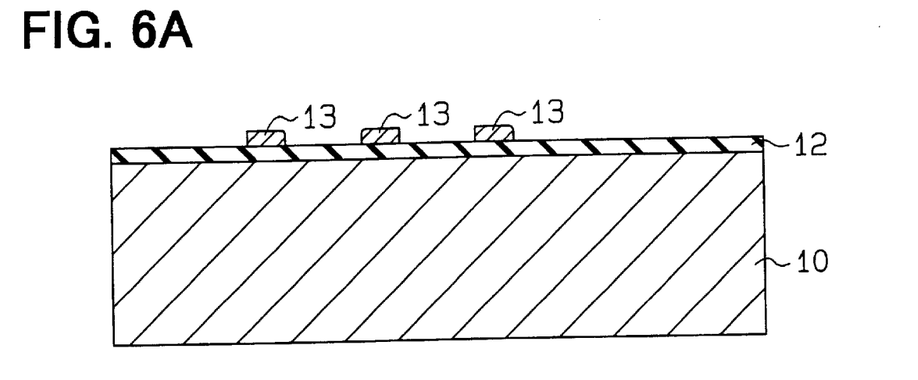
FIGS. 6A to 6C are cross-sectional views showing manufacturing steps of the infrared sensor in the first embodiment.
Figure 6B:
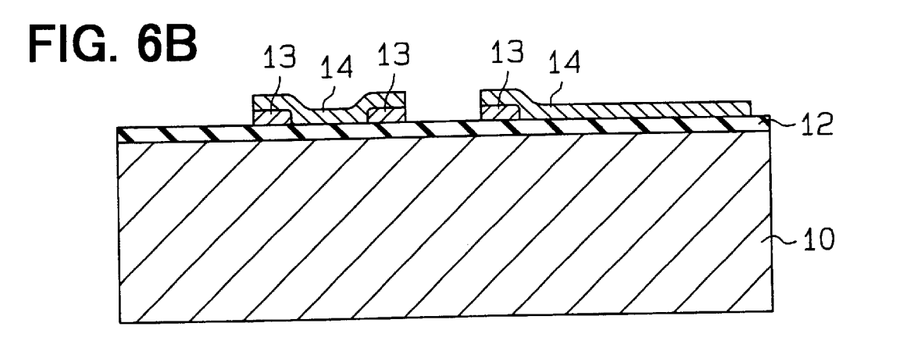
Figure 6C:
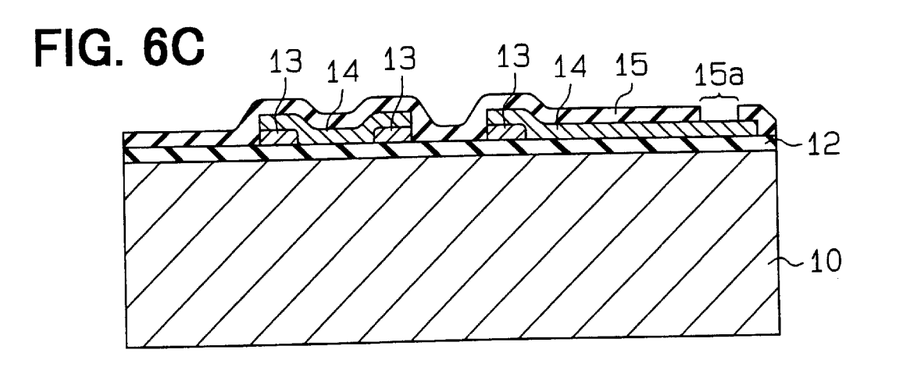

First, the silicon substrate 10 having a wafer shape is prepared as shown in FIG. 5A. Then, as shown in FIG. 5B, the silicon nitride film 12 is formed on the silicon substrate 10. As shown in FIG. 6A, the n-type poly-silicon film 13 is further deposited on the silicon nitride film 12, and is patterned in a desired shape by photoetching. Next, as shown in FIG. 6B, the aluminum film 14 is deposited on the silicon nitride film 12, and is patterned in a desired shape by photoetching. Then, as shown in FIG. 6C, the silicon nitride film 15 is deposited as a passivation film, and pad portions 15a are opened by photoetching.

Figure 7A:
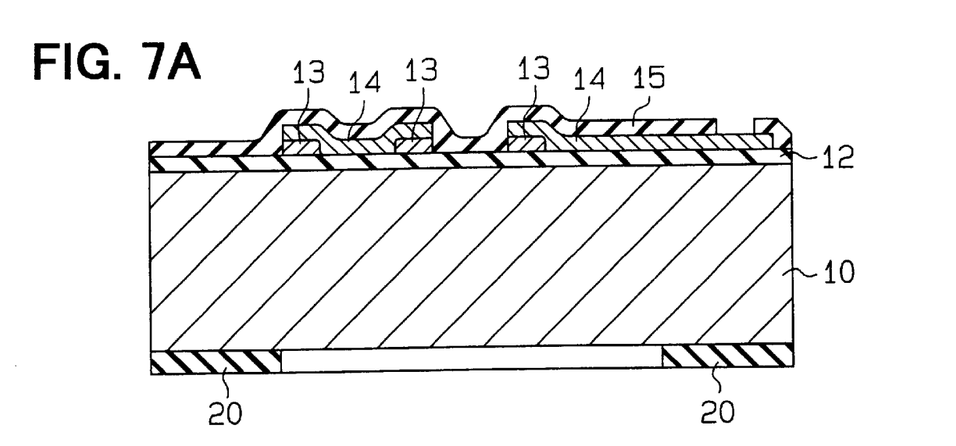
FIGS. 7A to 7C are cross-sectional views showing manufacturing steps of the infrared sensor in the first embodiment.
Figure 7B:
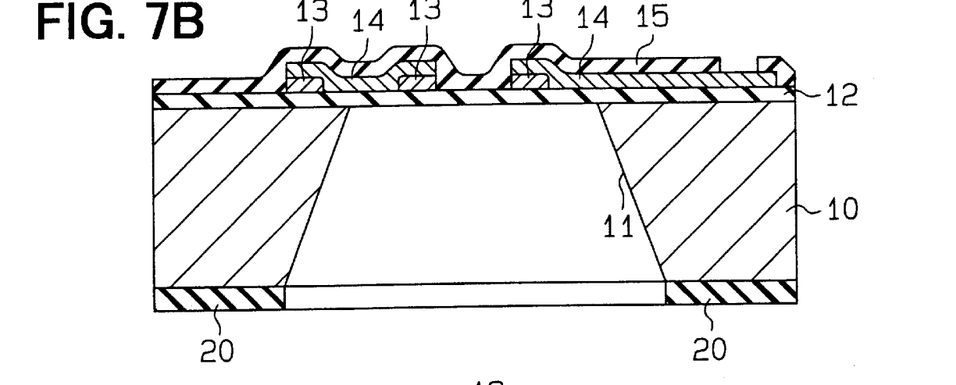

Next, as shown in FIG. 7A, a silicon nitride film 20 is deposited on the lower surface (back surface) of the silicon substrate 10, and is patterned in a desired shape by photoetching. Then, as shown in FIG. 7B, while the silicon nitride film 20 is used as a mask, the silicon substrate 10 is etched in an aqueous solution of KOH or the like to form the through hole 11. That is, a portion of the silicon substrate 10 is removed by anisotropic etching to form the membrane.

Figure 7C:
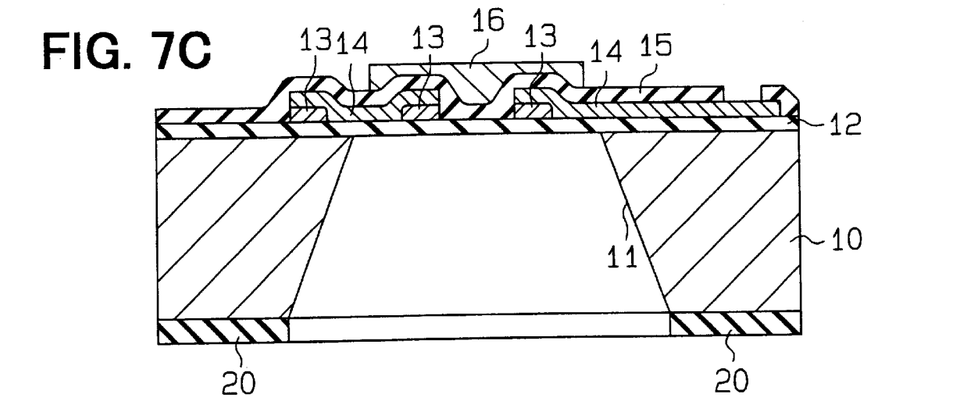

Then, as shown in FIG. 7C, the infrared absorbent film 16 such as a gold black film is formed on the passivation film 15 at a desired area (infrared radiation detecting portion). Thereafter, the wafer-shaped silicon substrate 10 is cut into sensor chips 3 by dicing or the like.

Figure 8:
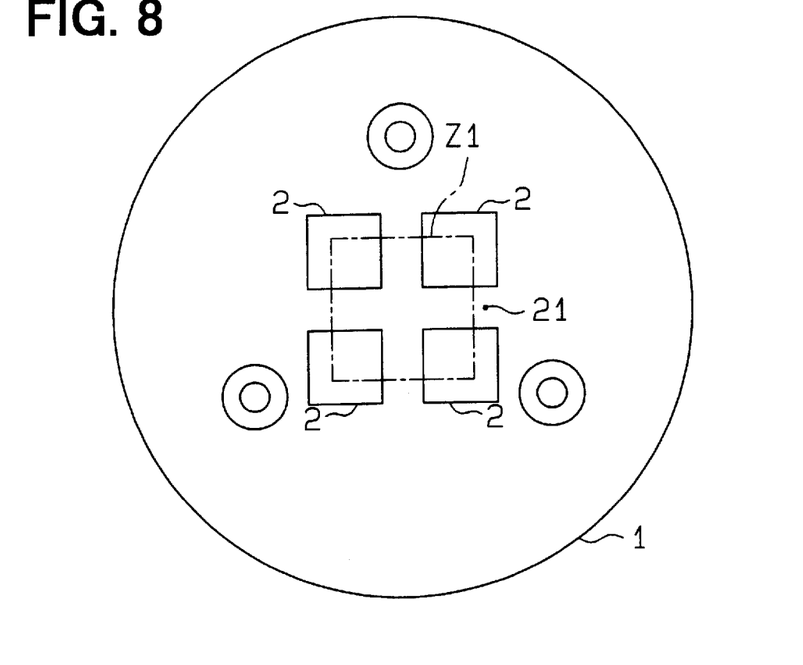
FIG. 8 is a plan view showing an adhesive application area in the first embodiment.

Thereafter, one of the sensor chips 3 (silicon substrate 10) is bonded to the stem 1 through the adhesive layer 2 such as silver paste. Here, adhesive application areas for connecting the stem 1 and the sensor chip 3 are provided on the stem 1 as shown in FIG. 8. FIG. 8 is a plan view showing the stem 1 to which the sensor chip 3 is not bonded. Further, the adhesive non-application area 21 having a cross shape is provided at a sensor-chip disposition area Z1 on the upper surface of the stem 1. That is, when the adhesive is applied to the stem 1, the adhesive is not applied to the entire sensor-chip disposition area Z1 of the upper surface of the stem 1. The adhesive is applied to the area Z1 so that the groove pattern (corresponding to the adhesive non-application area 21) is provided as shown in FIG. 8.

Accordingly, after sensor chip 3 is bonded to the stem 1 (refer to FIG. 2), the inner portion R1 and the outer portion R2 communicate with each other through the communication passage 21a defined by the groove pattern.

The adhesive is applied to the upper surface of the stem 1, which is to be bonded to the lower surface of the silicon substrate 10, and the silicon substrate 10 formed with the through hole 11 and the sensor element Es having the membrane structure is bonded to the stem 1. At this time, the adhesive is not applied to the predetermined area 21 of the sensor-chip disposition area Z1 on the upper surface of the stem 1. The predetermined area 21 allows the lower side open portion of the through hole 11 to communicate with the outside of the silicon substrate 10. Then, the silicon substrate 10 is bonded to the stem 1.

Furthermore, the sensor element Es is electrically connected to the pins 4 trough the bonding wires 6, and is sealed by welding the cap 7. At this time, the inside of the cap 7 is evacuated into vacuum or is filled with low thermal-conductivity gas to be hermetically sealed, thereby improving the sensor sensitivity.

Thereby, the semiconductor sensor, which has the membrane and is sealed under vacuum or specific gas, can be manufactured so that residual gas does not remain within the inner portion R1. When the sensor element is packaged with the can under vacuum, if the inner portion R1 has atmospheric pressure, the membrane may be broken due to the pressure difference between the inner portion R1 and the outer portion R2. In the first embodiment, however, the adhesive non-application area (groove pattern) 21 is provided so that the inner portion R1 is not hermetically sealed, and the inner portion R1 and the outer portion R2 of the through hole 11 communicate with each other through the adhesive non-application area 21 (communication passage 21a). As a result, the membrane can be prevented from being broken due to the pressure difference.

Further, if the inner portion R1 is hermetically sealed, gas within the inner portion R1 repeatedly expands and contracts thermally due to temperature changes even in a case that the sensor element is used in atmospheric air without being sealed in specific gas. As a result, the membrane is repeatedly bent (distortion is repeated), so that it is feared that sensor characteristics are changed or the sensor is broken. In the first embodiment, since the inner portion R1 and the outer portion R2 of the through hole 11 communicate with each other through the communication passage 21a, sensor characteristics can be prevented from being changed, and the sensor can be prevented from being broken.

As described above, because the inner portion R1 and the outer portion R2 communicate with each other through the communication passage 21a, both the upper and lower surfaces of the membrane have the same pressure. Therefore, the membrane can be prevented from being broken or the like, and reliability of the sensor is improved.

In the above embodiment, the adhesive layer 2 is provided on the stem 1. However, after an adhesive pattern is provided on the sensor chip 3, the sensor chip 3 can be bonded to the stem 1. That is, the adhesive may be applied to the silicon chip 3 having the through hole 11 and the sensor element Es, without being applied to a predetermined area of the lower surface of the silicon chip 3 through which the lower side open portion of the through hole 11 and the outer circumferential surface of the silicon chip 3 communicate with each other. Then, the silicon chip 3 can be bonded to the stem 1.

Second Embodiment

FIGS. 9 through 12 show a second preferred embodiment of the present invention, which will be described below mainly in points different from the first embodiment.

Figure 9:
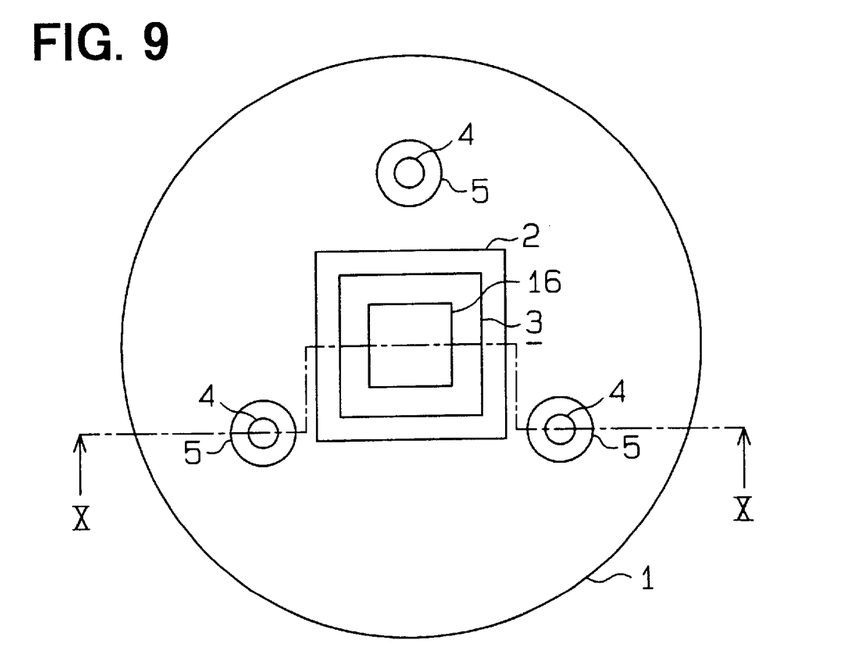
FIG. 9 is a plan view showing an infrared sensor, from which a can is removed, in a second preferred embodiment.
Figure 10:
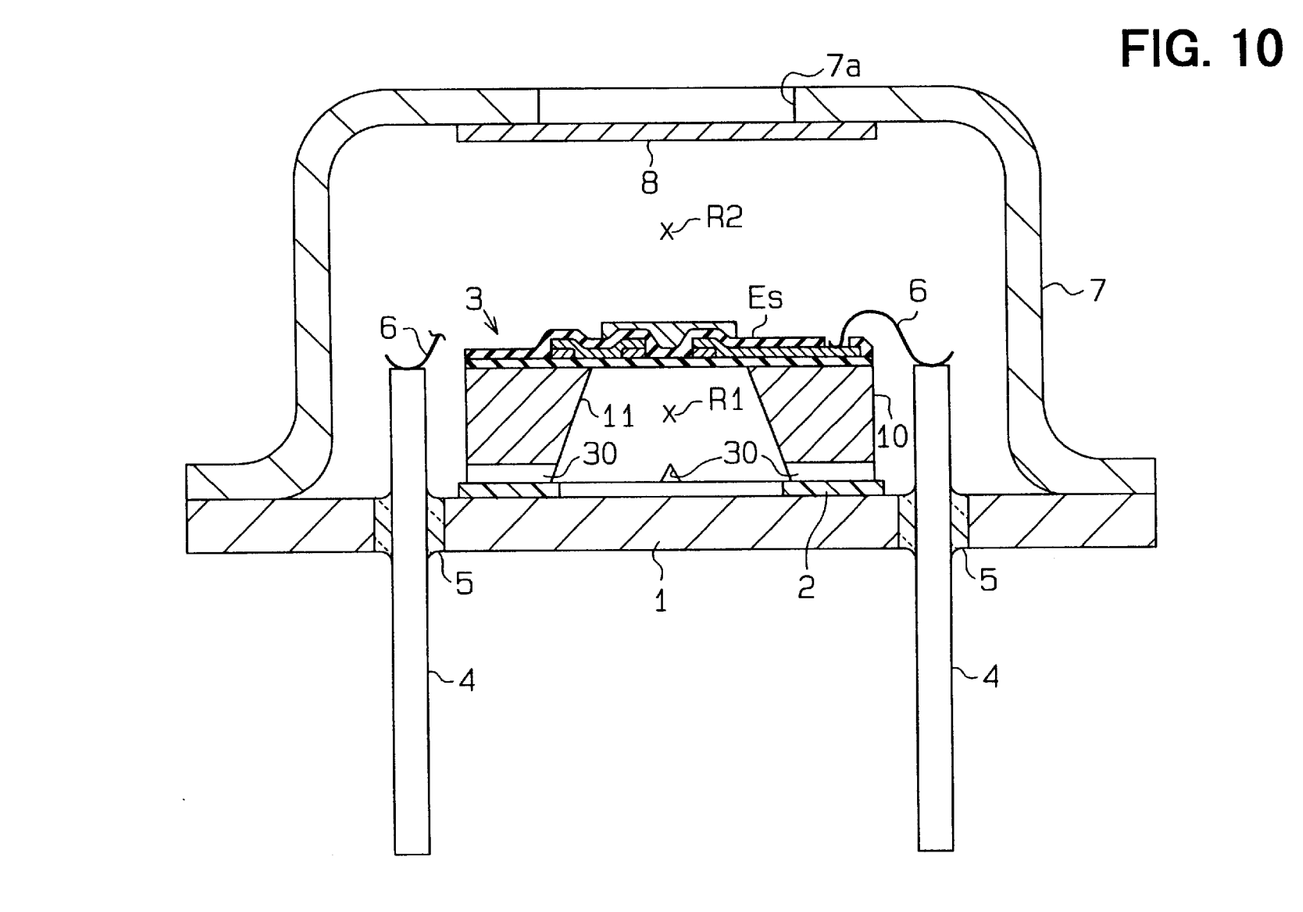
FIG. 10 is a cross-sectional view taken along line X—X in FIG. 9.
Figure 11:
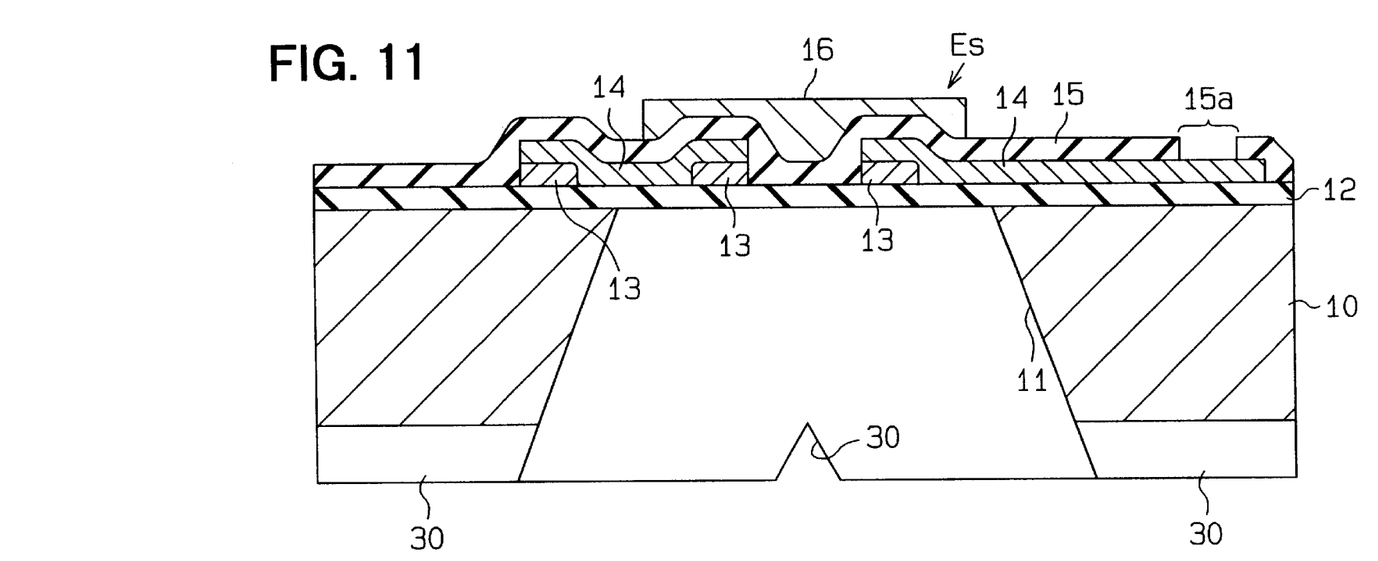
FIG. 11 is a cross-sectional view showing a sensor chip in the second embodiment.
Figure 12:
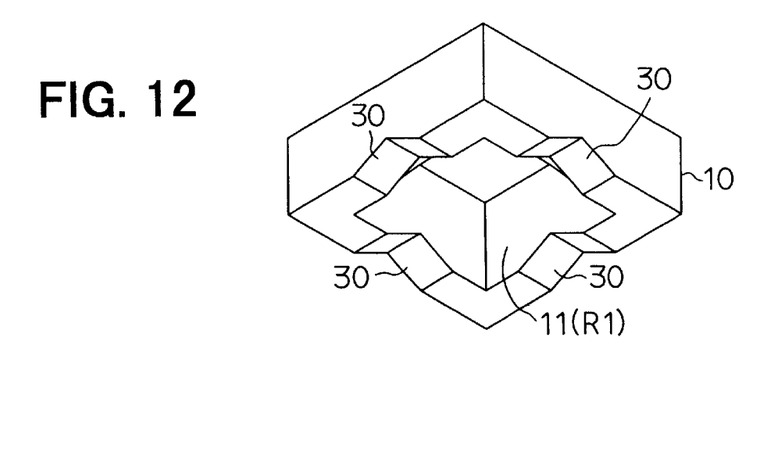
FIG. 12 is a perspective view showing a silicon substrate in the second embodiment.

In the second embodiment, as shown in FIG. 9, the adhesive layer 2 is provided on the stem 1 at an entire circumferential portion of the lower surface of the sensor chip 3. In addition, as shown in FIGS. 11 and 12, four V-shaped grooves 30 are provided on the lower surface of the sensor chip 3 (silicon substrate 10). These V-shaped grooves 30 extend so that the inner portion R1 of the through hole 11 and the outer circumferential surface of the silicon substrate 10 communicate with each other. Accordingly, after the sensor chip 3 is bonded to the stem 1, as shown in FIG. 10, the inner portion R1 and the outer portion R2 of the through hole 11 of the silicon substrate 10 communicate with each other through the V-shaped grooves 30.

In the second embodiment, the communication passage, through which the inner portion R1 and the outer portion R2 communicate with each other at the connection portion between the stem 1 and the silicon substrate 10, is provided by the grooves 30 formed on the lower surface of the silicon substrate 10.

Next, a manufacturing method of the present sensor will be described. First, as described with reference to FIGS. 5 and 6, the silicon nitride 12 is formed on the silicon substrate 10, and the n-type poly-silicon film 13 and the aluminum film 14 are formed in desired shapes on the silicon nitride film 12. Then, the silicon nitride film 15 is formed as a passivation film. These steps are substantially the same as those in the first embodiment.

Figure 13A:
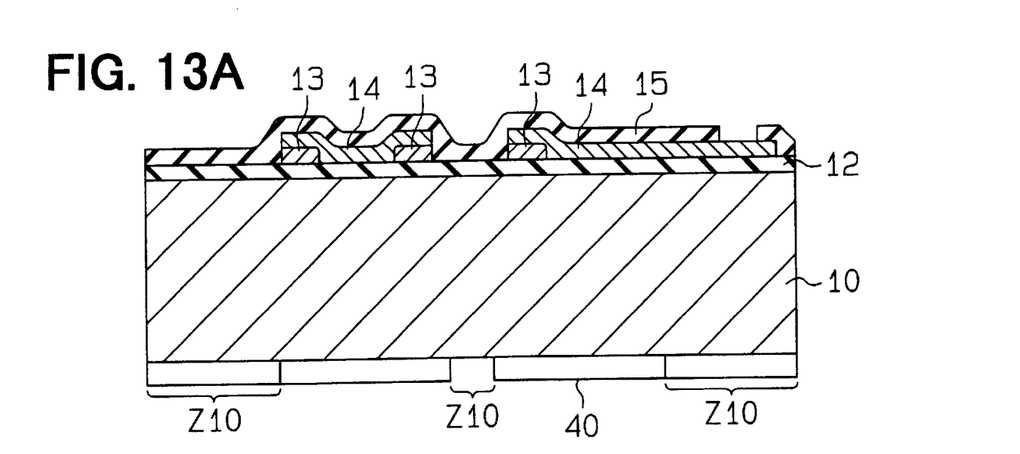
FIGS. 13A to 13C are cross-sectional views showing manufacturing steps of the infrared sensor in the second embodiment.

Next, as shown in FIG. 13A, a silicon nitride film 40 is deposited on the lower surface (back surface) of the silicon substrate 10, and is patterned in a desired shape by photo-etching. At this time, the silicon nitride film 40 is not formed at areas Z10 where the V-shaped grooves 30 are to be formed.

Figure 13B:
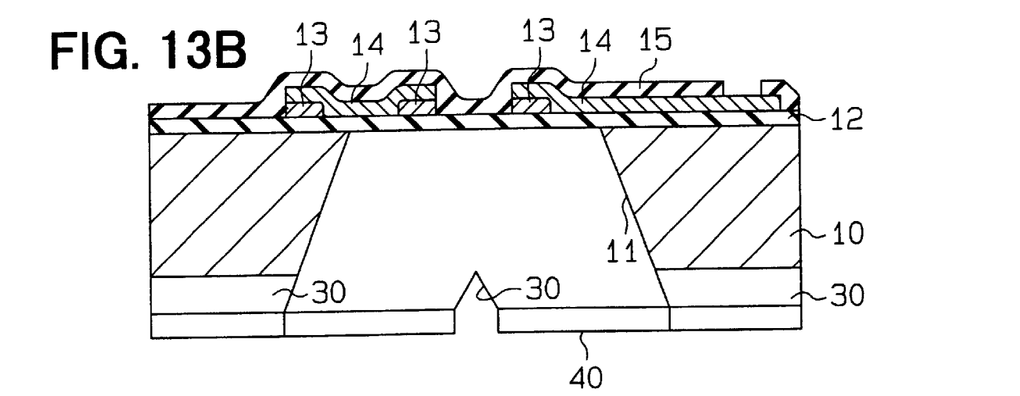

Then, as shown in FIG. 13B, the silicon substrate 10 is etched by anisotropic etching in an aqueous solution of KOH or the like using the silicon nitride film 40 as a mask, to form the through hole 11 (form the membrane). When this anisotropic etching is carried out to form the through hole 11, the V-shaped grooves 30 are formed on the silicon substrate 10 at the areas Z10 simultaneously. The V-shaped grooves 30 allow the inner portion R1 and the outer portion R2 of the through hole 11 to communicate with each other, i.e., allow the lower open portion of the through hole 11 to communicate with the outer circumferential surface of the silicon substrate.

Figure 13C:
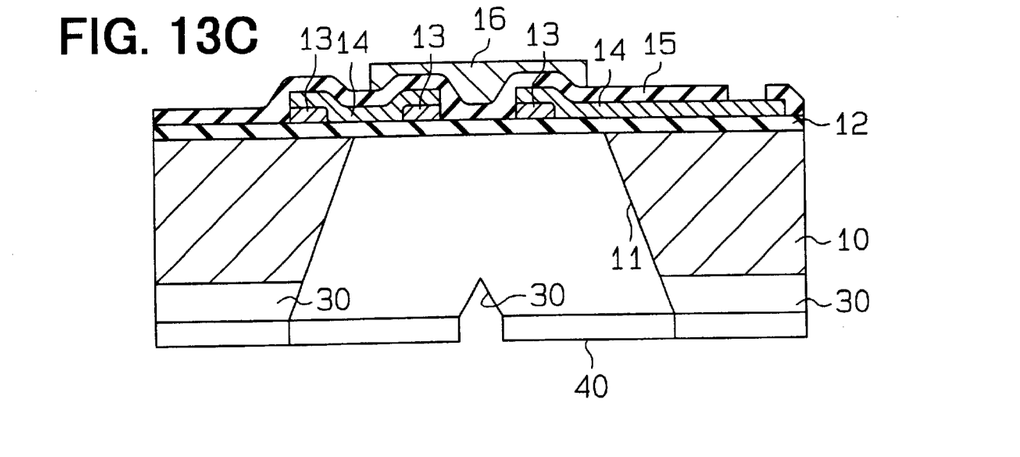

Successively, as shown in FIG. 13C, the infrared absorbent film 16 such as a gold black film is formed at a desired area (infrared radiation detecting portion). Thereafter, the wafer-shaped silicon substrate 10 is cut into the sensor chips 3 by dicing or the like.

As shown in FIG. 10, one of the sensor chips 3 (silicon substrate 10) is bonded to the stem 1 through the adhesive layer 2 such as silver paste. Then, the sensor chip 3 is electrically connected to the pins 4 trough the bonding wires 6, and is sealed by welding the cap 7 disposed to cover the sensor chip 3. At this time, the inside of the cap 7 is evacuated into vacuum or filled with low thermal-conductivity gas to be hermetically sealed, thereby improving the sensor sensitivity.

Thus, according to the second embodiment, the V-shaped grooves 30 are provided between the sensor chip 3 and the stem 1, so that the same advantages as described in the first embodiment can be provided. The grooves 30 can be provided on the silicon substrate 10 by another method. However, when the through hole 11 is formed by etching, the groves 30 should be formed simultaneously by using a mask. Accordingly, the number of manufacturing steps is not increased.

In the above-described embodiments, the present invention is applied to a thermopile-type infrared sensor. However, the present invention can be applied to an infrared sensor such as a bolometer-type sensor and a pyroelectric-type sensor other than a thermopile-type sensor. Further, the present invention can be applied to a membrane structure sensor such as a thermal-type flow sensor and a gas sensor other than an infrared sensor.

When the present invention is applied to a thermal-type flow sensor, a heater and a resistor are preferably formed as a platinum film on a membrane in place of a thermocouple of the infrared sensor. In this case, since the cap is not used, pressure may be changed in a detection space (R2). Even at this time, the membrane can be protected according to the present invention. In a case of a gas sensor, an organic film or an oxide film, which reacts with specific gas, is formed on a membrane.

Such changes and modifications are to be understood as being within the scope of the present invention as defined by the appended claims.

What is claimed is:

1. A method for manufacturing a sensor comprising:
   providing a semiconductor substrate, wherein the substrate has a main surface and a back surface and a through hole;
   forming a sensor element on the main surface such that the sensor element forms a membrane structure that closes the through hole, wherein the through hole is open on the back surface of the substrate;
   providing a base, which includes a bonding area;
   bonding the back surface of the semiconductor substrate to the bonding area of the base to define an inner space, which is enclosed by the substrate and the sensor element and the base, and an outer space, which is outside of the inner space, wherein the bonding defines at least one communication passage that connects the inner space with an outer space, such that the inner space and the outer space communicate only through the at least one communication passage.

2. The method according to claim 1, wherein the bonding includes:
   applying an adhesive to at Least one of the back surface and the bonding area on a region other than a region for defining the at least one communication passage; and
   bonding the back surface of the substrate to the bonding area with the adhesive, such that the adhesive is located between the back surface and the bonding area.

3. The method according to claim 1, wherein the method includes forming a groove on the back surface of the substrate, wherein the groove extends from the through hole to the outer surface of the substrate, and the at least one communication passage is defined by the groove when the substrate is bonded to the base.

4. The method according to claim 3, wherein the method includes forming the through hole and the groove simultaneously by etching the substrate.

5. The method according to claim 1, wherein the method includes enclosing the substrate in a closed chamber, such that the outer space is an inner space of the closed chamber and such that the at least one communication passage connects the inner space of the substrate with the inner space of the chamber.

6. The method according to claim 1, wherein the method includes exposing the sensor to an atmosphere, wherein the at least one communication passage connects the inner space of the substrate to the atmosphere.

7. method according to claim 1, wherein the method includes preventing pressure variation between the inside space and the outside space by permitting gas to flow through the at least one communication passage.

8. A method for manufacturing a sensor comprising:
   providing a semiconductor substrate, wherein the substrate has a main surface and a back surface and a through hole;
   forming a sensor element on the main surface such that the sensor element forms a membrane structure that closes the through hole, wherein the through hole is open on the back surface of the substrate;
   providing a base, which includes a first surface and a second surface and a bonding area, which is located on the first surface;
   bonding the back surface of the semiconductor substrate to the bonding area of the base to define an inner space, which is enclosed by the substrate and the sensor element and the base, and an outer space, which is outside of the inner space, wherein the bonding defines a communication passage between the substrate and the base that connects the inner space with an outer space; and
   preventing air from flowing into or out of the inner space through the base.

9. The method according to claim 8, wherein the bonding includes:
   applying an adhesive to at least one of the back surface and the bonding area on a region other than a region for defining the communication passage; and
   bonding the back surface of the substrate to the bonding area with the adhesive, such that the adhesive is located between the back surface and the bonding area.

10. The method according to claim 8, wherein the method includes forming a groove on the back surface of the substrate, wherein the groove extends from the through hole to the outer surface of the substrate, and the communication passage is defined by the groove when the substrate is bonded to the base.

11. The method according to claim 10, wherein the method includes forming the through hole and the groove simultaneously by etching the substrate.

12. The method according to claim 8, wherein the method includes enclosing the substrate in a closed chamber, such that the outer space is an inner space of the closed chamber and such that the communication passage connects the inner space of the substrate with the inner space of the chamber.

13. The method according to claim 8, wherein the method includes exposing the sensor to an atmosphere, wherein the communication passage connects the inner space of the substrate to the atmosphere.

14. The method according to claim 8, wherein the method includes preventing pressure variation between the inside space and the outside space by permitting gas to How through the communication passage.

15. A method for manufacturing a sensor comprising:
   providing a semiconductor substrate, wherein the substrate has a main surface and a back surface and a through hole;
   forming a sensor element on the main surface such that the sensor element forms a membrane structure that closes th through hole, wherein the through hole is open on the back surface of the substrate;
   providing a base, which includes a first surface and a second surface and a bonding area, which is located on the first surface;
   bonding the back surface of the semiconductor substrate to the bonding area of the base to define an inner space, which is enclosed by the substrate and the sensor element and the base, and an outer space, which is outside of the inner space, wherein the bonding defines a communication passage between the substrate and the base that connects the inner space with an outer space; and
   preventing pressure differences between the inner space and the outer space by permitting gas to flow through the communication passage to extend the life of the sensor.

16. The method according to claim 15, wherein the bonding includes:
  applying an adhesive to at least one of the back surface and the bonding area on a region other than a region for defining the communication passage; and
  bonding the back surface of the substrate to the bonding area with the adhesive, such that the adhesive is located between the back surface and the bonding area.

17. The method according to claim 15, wherein the method includes forming a groove on the back surface of the substrate, wherein the groove extends from the through hole to the outer surface of the substrate, and the communication passage is defined by the groove when the substrate is bonded to the base.

18. The method according to claim 17, wherein the method includes forming the through hole and the groove simultaneously by etching the substrate.

19. The method according to claim 15, wherein the method includes enclosing the substrate in a closed chamber, such that the outer space is an inner space of the closed chamber and such that the communication passage connects the inner space of the substrate with the inner space of the chamber.

20. The method according to claim 15, wherein the method includes exposing the sensor to an atmosphere, wherein the communication passage connects the inner space of the substrate to the atmosphere.

* * * * *